(12) United States Patent
Hsu

(10) Patent No.: US 9,796,597 B2
(45) Date of Patent: Oct. 24, 2017

(54) INDIUM OXIDE NANOROD AND MANUFACTURING METHOD THEREOF

(71) Applicant: Kuo-Ming Hsu, Yilan County (TW)

(72) Inventor: Kuo-Ming Hsu, Yilan County (TW)

(\*) Notice: Subject to any disclaimer, the term of this patent is extended or adjusted under 35 U.S.C. 154(b) by 0 days.

(21) Appl. No.: 14/740,293

(22) Filed: Jun. 16, 2015

(65) Prior Publication Data

US 2016/0075565 A1    Mar. 17, 2016

(30) Foreign Application Priority Data

Sep. 15, 2014  (TW) .............................. 103131775 A

(51) Int. Cl.

| | | |
|---|---|---|
| *C01D 15/00* | (2006.01) | |
| *C01G 15/00* | (2006.01) | |
| *C30B 23/00* | (2006.01) | |
| *C30B 29/16* | (2006.01) | |
| *C30B 29/60* | (2006.01) | |

(52) U.S. Cl.
CPC ............ *C01G 15/00* (2013.01); *C30B 23/007* (2013.01); *C30B 29/16* (2013.01); *C30B 29/60* (2013.01); *C01P 2004/16* (2013.01)

(58) Field of Classification Search
CPC ........ B82Y 40/00; B82Y 30/00; C01G 15/00; C01P 2004/13; C30B 29/16; C30B 29/60; C30B 29/602; C30B 23/007
See application file for complete search history.

(56) References Cited

FOREIGN PATENT DOCUMENTS

TW    201419569    5/2014

OTHER PUBLICATIONS

Kuo, D. H., C. W. Hsu, and C. H. Liang. "CVD growth of In2O3 nanowires using a mixed source of indium and indium chloride." Journal of The Electrochemical Society 155.9 (2008): K156-K160.*
Efficient Light Harvesting by Well-Aligned In2O3 Nanopushpins as Antireflection Layer on Si Solar Cells.*
Yan, You-Guo, et al. "In2O3 nanotowers: controlled synthesis and mechanism analysis." Crystal growth & design 7.5 (2007): 940-943.*
Calestani et al., "In-catalyzed growth of high-purity indium oxide nanowires," Chemical Physics Letters, Aug. 7, 2007, pp. 251-254.

(Continued)

*Primary Examiner* — Richard M Rump
(74) *Attorney, Agent, or Firm* — Jianq Chyun IP Office

(57) ABSTRACT

Provided is a manufacturing method of indium oxide nanorods, including the following steps: providing a temperature furnace divided into a first zone and a second zone; putting an indium metal source in the first zone and putting a substrate in the second zone; modulating a temperature of the first zone to a first temperature and modulating a temperature of the second zone to a second temperature, wherein the first temperature is higher than the second temperature; and inputting argon and oxygen into the temperature furnace when the temperature of the first zone reaches the first temperature and the temperature of the second zone reaches the second temperature, wherein a ratio of argon and oxygen is in a range of 30:1 to 70:1 such that a plurality of indium oxide nanorods are formed on the substrate. An indium oxide nanorod is also provided.

2 Claims, 2 Drawing Sheets

(56) References Cited

OTHER PUBLICATIONS

Kumar et al., "Self catalytic growth of indium oxide (In2O3) nanowires by resistive thermal evaporation," Journal of Nanoscience and Nanotechnology, Jul. 2014, vol. 14, pp. 5485-5490.

Hadia et al., "Synthesis, structure and optical properties of single-crystalline In2O3 nanowires," Journal of Alloys and Compounds, Sep. 5, 2012, pp. 63-67.

"Search Report of Europe Counterpart Application", issued on Feb. 23, 2016, p. 1-p. 7.

Lai, et al., "Nano-Screw," NanoScience, 2013 Annual Publication, Apr. 21, 2014, pp. 14.

Youguo Yan, et al., "Tunable synthesis of In2O3 nanowires, nanoarrows and nanorods," Nanotechnology, vol. 18, Apr. 2, 2007, pp. 1-6.

"Office Action of Taiwan Counterpart Application," dated Sep. 25, 2015, p. 1-p. 4.

C.Y. Huang et al., "Efficient Light Harvesting by Well-Aligned In2O3 Nanopushpins a Antireflection Layer on Si Solar Cells", The Journal or Physical Chemistry C, American Chemical Society, vol. 115, Jun. 7, 2011, pp. 13083-13087.

D. Calestani et al., "In-catalyzed growth of high-purity indium oxide nanowires", Chemical Physics Letters, Elsevier, Sep. 2007, vol. 445, pp. 251-254.

R.R. Kumar et al., "Self Catalytic Growth of Indium Oxide (In2O3) Nanowires by Resistive Thermal Evaporation", Journal of Nanoscience and Nanotechnology, American scientific publishers, Jul. 2014, vol. 14, No. 7, pp. 5485-5490.

"Office Action of Japan Counterpart Application", dated Aug. 16, 2016, p. 1-p. 4.

Kinson C. Kam et al.,"In2O3 nanowires, nanobouquets and nanotrees", Chemical Physics Letters, vol. 397, No. 4-6, Oct. 21, 2004, pp. 329-334.

"Office Action of European Counterpart Application," dated Jul. 20, 2017, p. 1-p. 5, in which the listed reference was cited.

* cited by examiner

INDIUM OXIDE NANOROD AND MANUFACTURING METHOD THEREOF

CROSS-REFERENCE TO RELATED APPLICATION

This application claims the priority benefit of Taiwan application serial no. 103131775, filed on Sep. 15, 2014. The entirety of the above-mentioned patent application is hereby incorporated by reference herein and made a part of this specification.

BACKGROUND OF THE INVENTION

Field of the Invention

The invention relates to a nanorod and a manufacturing method thereof, and more particularly relates to an indium oxide nanorod and a manufacturing method thereof.

Description of Related Art

With the rapid progress of science and technology, areas such as electronics, material, physics, chemistry, and biology have evolved from the Micron Era into the so-called Nano Era. When the device size is miniaturized to the nano-level, the physical, mechanical and chemical properties of the device differ from those when the device is still a block material. Therefore, in addition to changing the composition of the material to obtain required properties of different materials, basic characteristics such as the melting point, color, and optical, electrical, and magnetic properties of the same material may also be manipulated by controlling the size and shape of the material. High-performance products or techniques that cannot be achieved in the past may now be realized in the field of nano science and technology.

Generally, there are many types of nanomaterials, including metal, metal oxide, semiconductor, ceramics, polymer material, etc. In addition, nanostructures may be divided into one-dimensional, two-dimensional, and three-dimensional nanostructures according to different shapes, sizes, and distribution ranges. The current mechanisms for growth of nanostructures (e.g., nanorods) mainly include a vapor-liquid-solid (VLS) growth mechanism and a vapor-solid (VS) growth mechanism. According to the VLS growth mechanism, the vapor-phase reactant is attached to the metal catalyst to form a liquid alloy at the eutectic temperature. In the case where the material of the reactant is a semiconductor material, when the semiconductor material in the metal-semiconductor alloy is supersaturated, the semiconductor is precipitated from the bottom of the metal catalyst, and the precipitated semiconductor material pushes the metal catalyst up and thereby forms the nanorods having directionality. As compared with the VLS growth mechanism, the vapor-solid (VS) growth mechanism can grow nanostructures without the metal catalyst. However, due to the absence of the metal catalyst that can absorb the reactant and serve as the nucleation site, the nanostructures grown by the VS growth mechanism do not have directionality and require longer formation time (about 1 hour or more). Thus, how to efficiently manufacturing nanostructures having directionality without configuration of the metal catalyst is an issue that needs to be addressed.

SUMMARY OF THE INVENTION

The invention provides a manufacturing method for manufacturing indium oxide nanorods having directionality efficiently without configuration of a metal catalyst.

The invention provides an indium oxide nanorod having directionality.

The invention provides a manufacturing method of indium oxide nanorods, including the following steps: providing a temperature furnace divided into a first zone and a second zone; disposing at least one indium metal source in the first zone and disposing a substrate in the second zone; modulating a temperature of the first zone to a first temperature and modulating a temperature of the second zone to a second temperature, wherein the first temperature is higher than the second temperature; and introducing argon and oxygen into the temperature furnace when the temperature of the first zone reaches the first temperature and the temperature of the second zone reaches the second temperature, wherein a ratio of the argon and the oxygen is in a range of 30:1 to 70:1 so as to from a plurality of indium oxide nanorods on the substrate.

In an embodiment of the invention, the first temperature is in a range of 800 degrees Celsius to 1000 degrees Celsius, and the second temperature is in a range of 300 degrees Celsius to 500 degrees Celsius.

In an embodiment of the invention, the indium oxide nanorods are formed after the argon and the oxygen are introduced into the temperature furnace for one minute, and each of the indium oxide nanorods extends outward from a surface of the substrate.

In an embodiment of the invention, in thirty minutes after the argon and the oxygen are introduced into the temperature furnace, a length and an average diameter of each of the indium oxide nanorods are positively correlated to a time of introducing the argon and the oxygen.

In an embodiment of the invention, each of the indium oxide nanorods includes a bottom portion, a connection portion, and a top portion, wherein the bottom portion is in contact with the substrate, the connection portion is connected between the bottom portion and the top portion, the top portion is composed of indium, and the connection portion and the bottom portion are respectively composed of indium oxide.

The invention provides an indium oxide nanorod, including a bottom portion; a top portion opposite to the bottom portion; and a connection portion connected between the bottom portion and the top portion, wherein an average diameter of the top portion is greater than an average diameter of the connection portion and an average diameter of the bottom portion.

In an embodiment of the invention, the top portion is composed of indium, and the connection portion and the bottom portion are respectively composed of indium oxide.

In an embodiment of the invention, a width of the connection portion gradually decreases in a direction from the top portion to the bottom portion.

In an embodiment of the invention, each of the indium oxide nanorods has a thumbtack shape.

Based on the above, according to the manufacturing method of the above embodiments of the invention, indium is self-nucleated on the substrate through dual-zone heating and control of the ratio of argon and oxygen in the temperature furnace, and the subsequently foamed indium oxide pushes the indium up to form the indium oxide nanorods having directionality.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Figure 1A:
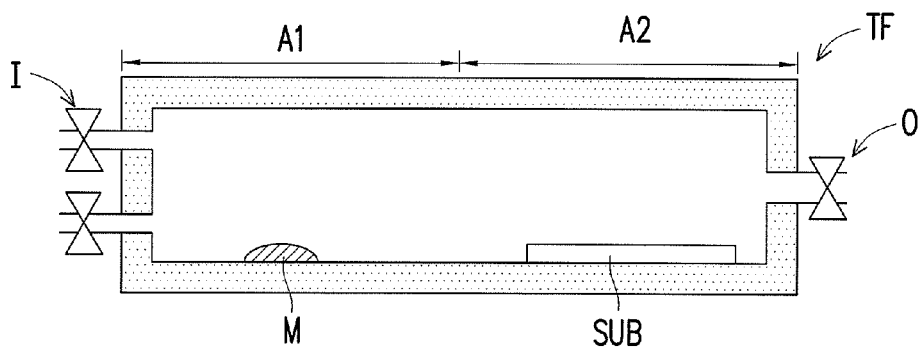
FIG. 1A to FIG. 1D are schematic views showing a manufacturing method of indium oxide nanorods according to an embodiment of the invention.

FIG. 1A to FIG. 1D are schematic views showing a manufacturing method of indium oxide nanorods according to an embodiment of the invention. FIG. 2 is a schematic view showing an indium oxide nanorod according to an embodiment of the invention. With reference to FIG. 1A, a temperature furnace TF is provided. The temperature furnace TF includes a plurality of inlet valves I and at least one outlet valve O, wherein the inlet valves I and the outlet valve O respectively communicate with a chamber inside the temperature furnace TF for inputting or outputting a carrier gas in the subsequent process.

The temperature furnace TF is divided into a first zone A1 and a second zone A2, wherein the first zone A1 and the second zone A2 communicate with each other to facilitate flow of the carrier gas. In this embodiment, the temperature furnace TF is provided with temperature control equipment respectively corresponding to the first zone A1 and the second zone A2 for independently controlling temperatures of the first zone A1 and the second zone A2.

At least one indium metal source M is disposed in the first zone A1, and a substrate SUB is disposed in the second zone A2. The indium metal source M is provided for forming desired indium oxide nanorods, which may be indium granules having purity of 99.99%, but not limited thereto. The substrate SUB is provided for carrying the indium oxide nanorods that are to be formed. For example, the substrate SUB is a sapphire substrate, a silicon substrate, a copper substrate, a silicon carbide (SiC) substrate, a stack layer having a semiconductor structure, or other suitable substrates. In addition, an element or layer may be formed in advance on the substrate SUB according to different design requirements.

Figure 1B:
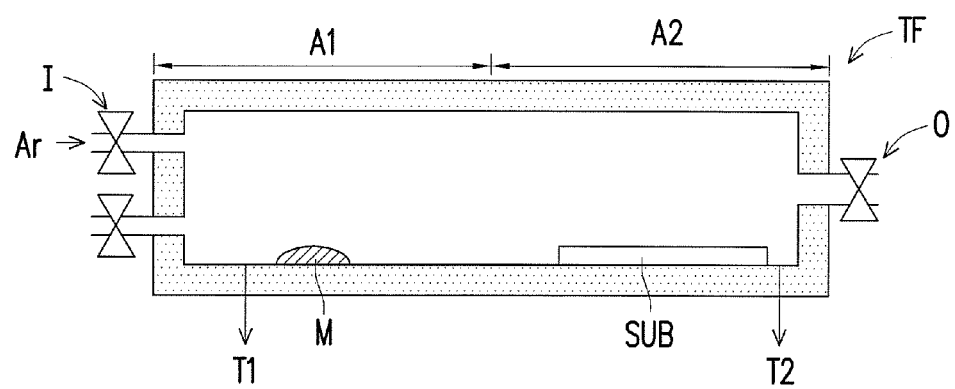
Figure 2:
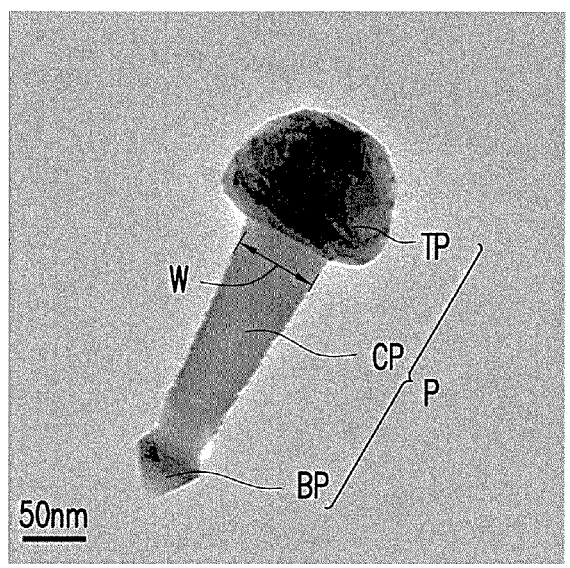
FIG. 2 is a schematic view showing an indium oxide nanorod according to an embodiment of the invention.

With reference to FIG. 1B, the temperature of the first zone A1 is modulated to a first temperature T1, and the temperature of the second zone A2 is modulated to a second temperature T2, wherein the first temperature T1 is higher than the second temperature T2. For example, the first temperature T1 is in a range of 800 degrees Celsius to 1000 degrees Celsius, and the second temperature T2 is in a range of 300 degrees Celsius to 500 degrees Celsius. Before the temperature modulation, a vacuum may be created in the temperature furnace TF. Next, argon Ar is introduced through the inlet valve I to increase a gas pressure in the temperature furnace TF to an atmospheric pressure, and then the modulation of the temperature of the first zone A1 to the first temperature T1 and the temperature of the second zone A2 to the second temperature T2 begins.

Figure 1C:
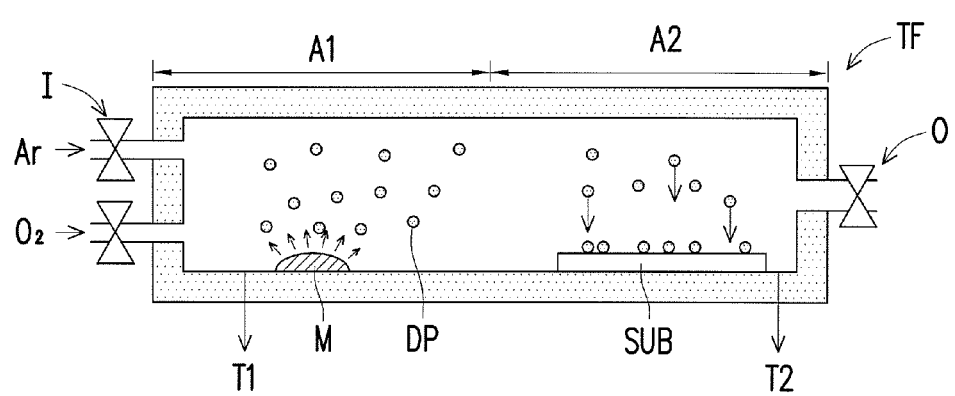
Figure 1D:
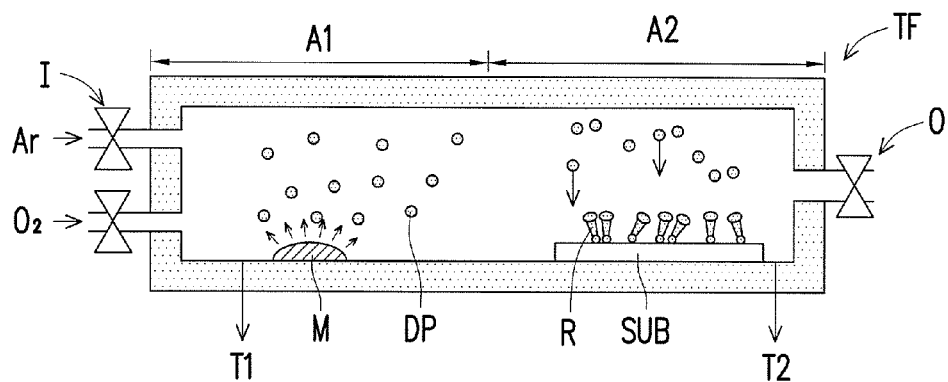

With reference to FIG. 1C and FIG. 1D, when the temperature of the first zone A1 reaches the first temperature T1 and the temperature of the second zone A2 reaches the second temperature T2, the argon Ar and oxygen $O_2$ are introduced into the temperature furnace TF. The argon Ar and the oxygen $O_2$ are respectively inputted through different valves I, and a ratio of the argon Ar to the oxygen $O_2$ is in a range of 30:1 to 70:1, so as to form a plurality of indium oxide nanorods Ron the substrate SUB.

Since the chemical reaction changes exponentially with the temperature, with the indium metal source M disposed in the first zone A1 where the temperature is relatively high (e.g., 900 degrees Celsius), the chemical reaction of bonding of oxygen and indium is accelerated to form indium-indium oxide nano-droplets DP. Due to the difference in concentration of the carrier gas between the first zone A1 and the second zone A2, the nano-droplets DP are brought to the second zone A2 where the temperature is relatively low by diffusion and adsorbed onto a surface of the substrate SUB to form nucleation sites. At the second temperature T2, an oxidation rate of indium is greater than a reduction rate thereof. Therefore, the indium oxide nanorods R are self-catalyzed in the second zone A2. In particular, the indium oxide pushes the self-nucleated indium up to form the indium oxide nanorods R having directionality. Thus, by performing the manufacturing method of this embodiment, the indium oxide nanorods R having directionality are manufactured efficiently without configuration of a metal catalyst. In addition, since the substrate SUB that carries the indium oxide nanorods R is disposed in the second zone A2 where the temperature is relatively low, damage to the substrate SUB or elements disposed in advance on the substrate SUB due to high temperature is prevented.

In this embodiment, the indium oxide nanorods R are formed after the argon Ar and the oxygen $O_2$ are introduced into the temperature furnace TF for one minute, and each of the indium oxide nanorods R extends outward from the surface of the substrate SUB. In particular, in thirty minutes after the argon Ar and the oxygen $O_2$ are introduced into the temperature furnace TF, a length and an average diameter of each indium oxide nanorod R are positively correlated to the time of introducing the argon Ar and the oxygen $O_2$. In other words, the length and the average diameter of each indium oxide nanorod R increases with the time of the manufacturing process.

With reference to FIG. 1D and FIG. 2, each indium oxide nanorod R includes a bottom portion BP, a connection portion CP, and a top portion TP. The bottom portion BP is in contact with the substrate SUB. The connection portion CP is connected between the bottom portion BP and the top portion TP. An average diameter of the top portion TP is greater than an average diameter of the connection portion CP and an average diameter of the bottom portion BP, so as to form a thumbtack-shaped structure. In addition, a width W of the connection portion CP gradually decreases in a direction from the top portion TP to the bottom portion BP. As shown in FIG. 2, a width of a junction between the connection portion CP and the bottom portion BP is smaller than a width of a junction between the connection portion CP and the top portion TP. According to a result of analysis obtained through a tunneling electron microscope, the top portion TP is composed of indium, and the connection portion CP and the bottom portion BP are respectively composed of indium oxide, for example.

Figure 3:
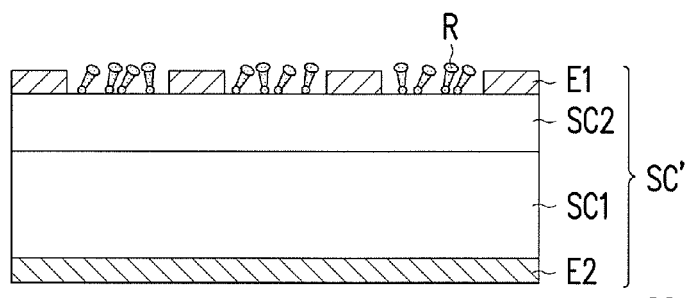
FIG. 3 is a schematic cross-sectional view showing a solar panel using the indium oxide nanorods of the embodiment of the invention.

An application of the indium oxide nanorods R is described below with reference to FIG. 3. FIG. 3 is a schematic cross-sectional view showing a solar panel using the indium oxide nanorods of the embodiment of the invention. With reference to FIG. 3, a solar panel SC includes a first-type semiconductor layer SC1, a second-type semiconductor layer SC2, a top electrode E1, a back electrode E2, and a plurality of indium oxide nanorods R.

The second-type semiconductor layer SC2 is disposed on the first-type semiconductor layer SC1. One of the first-type semiconductor layer SC1 and the second-type semiconductor layer SC2 is an N-type semiconductor layer and the other one is a P-type semiconductor layer. For example, the first-type semiconductor layer SC1 is a P-type semiconductor layer and the second-type semiconductor layer SC2 is an N-type semiconductor layer. However, it should be noted that the invention is not limited thereto.

The top electrode E1 is disposed on the second-type semiconductor layer SC2, which may be a metal layer having favorable conductivity, e.g., a titanium layer, an aluminum layer, or a stack layer thereof. Further, in order to prevent the top electrode E1 from blocking ambient light from outside, the top electrode E1 may be formed with a specific electrode pattern. For example, the top electrode E1 may include a plurality of busbar electrodes and a plurality of finger electrodes extending from the busbar electrodes. The back electrode E2 is disposed under the first-type semiconductor layer SC1 for providing a back surface field (BSF). The back electrode E2 may be a metal layer having favorable conductivity, such as an aluminum layer. The indium oxide nanorods R are disposed on the second-type semiconductor layer SC2 and located in a region outside the top electrode E1. The indium oxide nanorods R may be manufactured by the aforementioned manufacturing method, and under this configuration, a solar panel SC' not formed with the indium oxide nanorods R is the aforementioned substrate SUB for carrying the indium oxide nanorods R.

Before the indium oxide nanorods R are disposed, because refractive indexes of air and the second-type semiconductor layer SC2 do not match, most light emitted to the solar panel SC' may be reflected back to the air by an interface between the second-type semiconductor layer SC2 and air and not effectively absorbed by the solar panel SC', resulting in low power generation efficiency.

By disposing the indium oxide nanorods R, a density ratio of a medium in the air is changed to provide an effect of graded refractive indexes. Thereby, the proportion of the light that cannot be absorbed due to the unmatched refractive indexes is reduced. In particular, the indium oxide nanorods R are in the nano-level and can provide a full-band anti-reflection effect and maintain low reflectivity even at a large incident angle. According to an actual test, for a wavelength ranging from 350 nm to 950 nm, the solar panel SC with the indium oxide nanorods R reduces the average reflectivity from 35.73% to 10% or less. In other words, the configuration of the indium oxide nanorods R achieves both the effects of broadband and omni-direction, such that the solar panel SC can fully absorb incident light at each band from every angle.

An example of application of the indium oxide nanorods R is described as above; however, it should be noted that the application of the indium oxide nanorods R is not limited thereto. For example, the indium oxide nanorods R can also be used in other semiconductor devices. Or, the indium oxide nanorods R can be used in a sensing device (e.g., an acoustic sensing device) for improving the sensing surface area and thereby enhancing the sensing performance of the sensing device. Or, a distinctive light excitation band of the indium oxide nanorods R may be used for manufacturing a nano laser element or a field emission display element.

To conclude the above, according to the manufacturing method of the embodiments of the invention, indium is self-nucleated on the substrate through dual-zone heating and control of the ratio of argon and oxygen in the temperature furnace, and the subsequently formed indium oxide pushes the indium up to form the indium oxide nanorods having directionality.

It will be apparent to those skilled in the art that various modifications and variations can be made to the disclosed embodiments without departing from the scope or spirit of the invention. In view of the foregoing, it is intended that the invention covers modifications and variations of this disclosure provided that they fall within the scope of the following claims and their equivalents.

What is claimed is:

1. An indium oxide nanorod, comprising:
   a bottom portion;
   a top portion opposite to the bottom portion; and
   a connection portion connected between the bottom portion and the top portion, wherein an average diameter of the top portion is greater than an average diameter of the connection portion and an average diameter of the bottom portion, wherein a width of the connection portion decreases in a direction from the top portion to the bottom portion, and the connection portion is longer than the top portion and the bottom portion, wherein the top portion is consisting of indium, and the connection portion and the bottom portion are respectively consisting of indium oxide.

2. The indium oxide nanorod according to claim 1, wherein each of the indium oxide nanorods has a thumbtack shape.

* * * * *